(12) United States Patent
Bae et al.

(10) Patent No.: US 7,999,458 B2
(45) Date of Patent: Aug. 16, 2011

(54) ORGANIC ELECTRO LUMINESCENCE DEVICE AND FABRICATION METHOD THEREOF

(75) Inventors: Sung Joon Bae, Seongnam-si (KR); Jae Yoon Lee, Seoul (KR); Kyung Man Kim, Seoul (KR); Joon Suk Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 1279 days.

(21) Appl. No.: 11/171,146

(22) Filed: Jun. 29, 2005

(65) Prior Publication Data

US 2006/0055999 A1 Mar. 16, 2006

(30) Foreign Application Priority Data

Aug. 26, 2004 (KR) .......................... 10-2004-0067383
Dec. 2, 2004 (KR) .......................... 10-2004-0100628

(51) Int. Cl.
*H01J 1/62* (2006.01)
*H01J 63/04* (2006.01)

(52) U.S. Cl. ...................................... 313/504; 313/512

(58) Field of Classification Search .................. 313/504, 313/505, 506, 512, 498, 500; 315/169.3; 445/24, 25
See application file for complete search history.

(56) References Cited

U.S. PATENT DOCUMENTS

| | | | |
|---|---|---|---|
| 6,373,187 B1 * | 4/2002 | Nagayama et al. | 313/506 |
| 6,407,408 B1 * | 6/2002 | Zhou et al. | 257/40 |
| 6,548,961 B2 * | 4/2003 | Barth et al. | 315/169.3 |
| 6,583,584 B2 * | 6/2003 | Duineveld et al. | 315/169.3 |
| 6,630,785 B1 * | 10/2003 | Lu | 313/505 |
| 6,891,327 B2 * | 5/2005 | Duineveld et al. | 313/505 |
| 7,122,957 B2 * | 10/2006 | Duineveld et al. | 313/506 |
| 7,202,597 B2 * | 4/2007 | Sakurai | 313/500 |
| 7,211,947 B2 * | 5/2007 | Kim | 313/506 |
| 7,391,151 B2 * | 6/2008 | Koo et al. | 313/504 |
| 7,453,199 B2 * | 11/2008 | Sakai | 313/504 |
| 7,495,389 B2 * | 2/2009 | Noguchi et al. | 313/506 |
| 7,573,195 B2 * | 8/2009 | Lifka et al. | 313/507 |
| 2003/0094607 A1 * | 5/2003 | Guenther et al. | 257/40 |
| 2004/0012329 A1 * | 1/2004 | Kobayashi | 313/504 |
| 2004/0017162 A1 * | 1/2004 | Sato et al. | 315/169.3 |
| 2004/0021413 A1 * | 2/2004 | Ito et al. | 313/504 |
| 2005/0140303 A1 * | 6/2005 | Lee et al. | 315/169.3 |
| 2005/0236956 A1 * | 10/2005 | Chung et al. | 313/463 |
| 2005/0285511 A1 * | 12/2005 | Bae et al. | 313/504 |
| 2006/0202205 A1 * | 9/2006 | Lee et al. | 257/59 |
| 2007/0052349 A1 * | 3/2007 | Giraldo et al. | 313/506 |

* cited by examiner

*Primary Examiner* — Nimeshkumar D Patel
*Assistant Examiner* — Glenn Zimmerman
(74) *Attorney, Agent, or Firm* — Brinks Hofer Gilson & Lione (57) ABSTRACT

An organic electro luminescence device is presented in which ink forming an organic electro luminescent layer is prevented from overflowing edges of a pixel region. The organic electro luminescent device includes first and second substrates and sub-pixels in the first and second substrates. An array element includes a thin film transistor formed on the first substrate in each sub-pixel. A first electrode is formed at an inner surface of the second substrate. A buffer is formed at an outer region to partition each sub-pixel formed on the first electrode. A first electrode separator is formed on the buffer and a second electrode separator is formed in a region including a stepped portion of the buffer. An organic electro luminescent layer is formed within a region partitioned by the second electrode separator. A second electrode is formed on the second substrate where the organic electro luminescent layer is formed.

27 Claims, 8 Drawing Sheets

ORGANIC ELECTRO LUMINESCENCE DEVICE AND FABRICATION METHOD THEREOF

PRIORITY CLAIM

This application claims the benefit of Korean Patent Application Nos. 2004-67383 filed on Aug. 26, 2004 and 2004-100628 filed on Dec. 2, 2004, which are hereby incorporated by reference.

FIELD OF THE INVENTION

The present invention relates to an organic electro luminescence device, and more particularly, to a dual panel type organic electro luminescence device and a fabrication method thereof.

DESCRIPTION OF THE RELATED ART

In the field of flat panel display devices (FPDs), a liquid crystal display device (LCD) is widely used because it is lightweight and has low power consumption. However, the LCD is not a light emitting device but a light receiving device and has technical limitations in brightness, contrast, viewing angle, and trend toward large size. Therefore, new flat panel display devices capable of overcoming these drawbacks have been developed actively.

One of the new flat panel display devices is an organic electro luminescence device. Since the organic electro luminescence device is a self-luminous display device, it has a high contrast and wide viewing angle compared with the LCD. Also, since the organic electro luminescence device does not require a backlight assembly, it is lightweight and slim. In addition, the organic electro luminescence device can decrease power consumption.

Further, the organic electro luminescence device can be driven at a low DC voltage and has a rapid response time. Since all of the components of the organic electro luminescence device are formed of solid materials, it is endurable against external impact. It also has a wide temperature range and can be manufactured at low cost.

Specifically, the organic electro luminescence device is easily fabricated through a deposition process and an encapsulation process. Therefore, the fabrication method and apparatus of the organic electro luminescence device are simpler than those of an LCD or PDP.

If the organic electro luminescence device is driven in an active matrix type, uniform brightness can be obtained even when a low current is applied. Accordingly, the organic electro luminescence device has advantages of low power consumption, high definition and large-sized screen.

Figure 1:
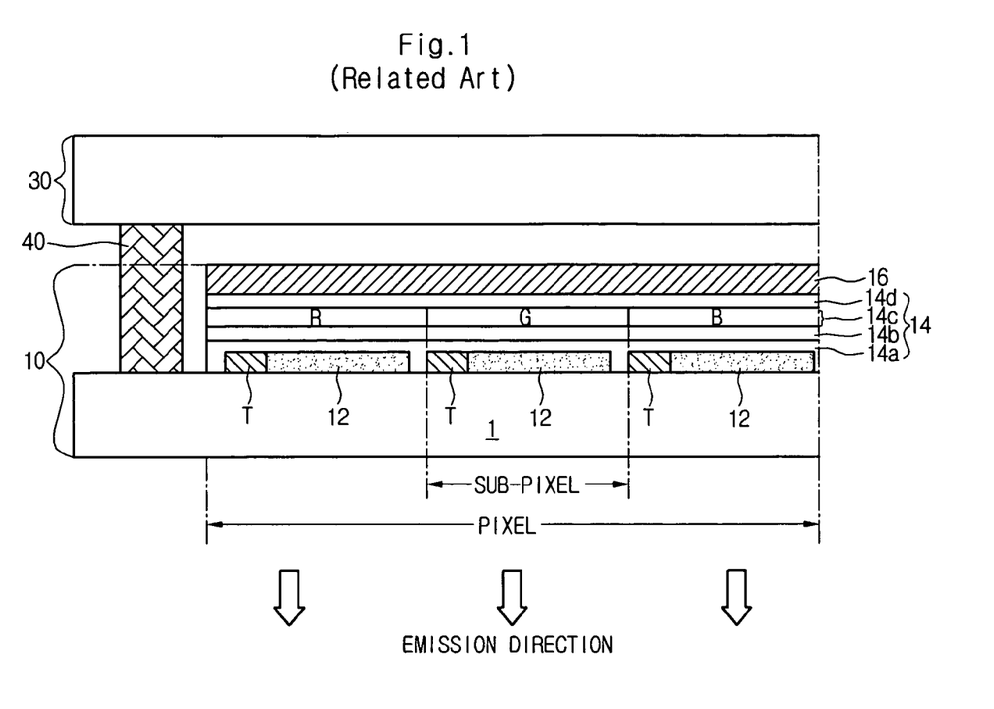
FIG. 1 is a sectional view of a related art organic electro luminescence device.

FIG. 1 is a schematic sectional view of a related art bottom emission type active matrix organic electro luminescence device (AMOLED).

As shown in FIG. 1, first and second substrates 10 and 30 are arranged to face each other. Edge portions of the first and second substrates 10 and 30 are encapsulated by a seal pattern 40. A TFT T is formed on a transparent substrate 1 of the first substrate 10 in sub-pixel unit. A first electrode 12 is connected to the TFT T. An organic electro luminescent layer 14 is formed on the TFT T and the first electrode 12 and is arranged corresponding to the first electrode 12. The organic electro luminescent layer 14 contains light emission materials taking on red, green and blue colors. A second electrode 16 is formed on the organic electro luminescent layer 14.

The first and second electrodes 12 and 16 function to apply an electric field to the organic electro luminescent layer 14.

Due to the seal pattern 40, the second electrode 16 and the second substrate 30 are spaced apart from each other by a predetermined distance. An absorbent (not shown) and a translucent tape (not shown) may be further provided in an inner surface of the second substrate 30. The absorbent absorbs moisture introduced from an exterior, and the translucent tape adheres the absorbent to the second substrate 30.

In the bottom emission type structure, when the first electrode 12 and the second electrode 16 are respectively used as an anode and a cathode, the first electrode 12 is formed of a transparent conductive material and the second electrode 16 is formed of a metal having a low work function. In such a condition, the organic electro luminescent layer 14 includes a hole injection layer 14a, a hole transporting layer 14b, an emission layer 14c, and an electron transporting layer 14d, which are sequentially formed on a layer contacting the first electrode 12.

The emission layer 14c has red, green and blue color filters in sub-pixels.

In the related art organic electro luminescence device, the array element and the organic electro luminescent diode are stacked on the same substrate.

The bottom emission type organic electro luminescence device is fabricated by attaching the substrate, where the array element and the organic electro luminescent diode are formed, to the separate substrate provided for the encapsulation. In this case, the yield of the organic electro luminescence device is determined by the product of the yield of the array element and the yield of the organic electro luminescent diode. Therefore, the entire process yield is greatly restricted by the last process, that is, the process of forming the organic electro luminescent diode. For example, even though excellent array elements are formed, if foreign particles or other factors cause defects in forming the organic electro luminescent layer using a thin film of about 1000 Å thick, the corresponding organic electro luminescence device is defective.

Thus, fabrication expense and material cost spent in fabricating the non-defective array element is lost, resulting in the reduction of the yield.

In addition, the bottom emission type organic electro luminescence device has high stability and high degree of freedom due to the encapsulation, but limited aperture ratio. Thus, it is difficult to use the bottom emission type organic electro luminescence device in high-definition products. Meanwhile, for the top emission type organic electro luminescence devices, the design of the TFTs is easy and the aperture ratio is high. However, since the cathode is disposed on the organic electro luminescent layer, the selection of material is restricted. Consequently, the transmittance is limited and the luminous efficiency is degraded.

SUMMARY OF THE INVENTION

By way of introduction only, an organic electro luminescence device and a fabrication method is presented in which an organic electro luminescent layer of high molecular material can be uniformly formed. In the organic electro luminescence device, a first electrode separator is formed in a inverse tapered shape on a buffer, and a second electrode separator is further formed in a roundly tapered shape on a region including a stepped portion of the buffer.

In one aspect, an organic electro luminescence device is provided that includes: first and second substrates arranged spaced apart from each other by a predetermined distance, the first and second substrates facing each other, sub-pixels being defined in the first and second substrates; an array element including a switch formed on the first substrate; a first electrode formed at an inner surface of the second substrate; a buffer formed at an outer region to partition the sub-pixels formed on the first electrode; a first electrode separator formed on the buffer, and a second electrode separator formed in a region including a stepped portion of the buffer; an organic electro luminescent layer formed within a region partitioned by the second electrode separator; and a second electrode formed on the second substrate where the organic electro luminescent layer is formed.

In another aspect of the present invention, there is provided a fabrication method of an organic electro luminescence device, the fabrication method including: forming an array element including a switch formed on an inner surface of a first substrate in each sub-pixel; forming a first electrode on a transparent substrate; forming a buffer at an outer region of each sub-pixel to partition each sub-pixel formed on the first electrode; forming a first electrode separator on a predetermined portion of the buffer, and forming a second electrode separator in a region including a stepped portion of the buffer; forming an organic electro luminescent layer within a region partitioned by the second electrode separator in each sub-pixel; forming a second electrode on the second substrate where the organic electro luminescent layer is formed; and attaching the first and second substrates.

In another aspect, an organic electro luminescence device comprises: a substrate; a first electrode formed on an inner surface of the substrate; a buffer formed on the first electrode and defining a sub-pixel; a first electrode separator formed on the buffer; an insulating second electrode separator covering a stepped portion of each side of the buffer formed such that adjacent second electrode separators are disposed on opposing sides of the first electrode separator in a cross-sectional view; an organic electro luminescent layer formed within a region partitioned by the second electrode separators; and a second electrode formed on the substrate where the organic electro luminescent layer is formed.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 2:
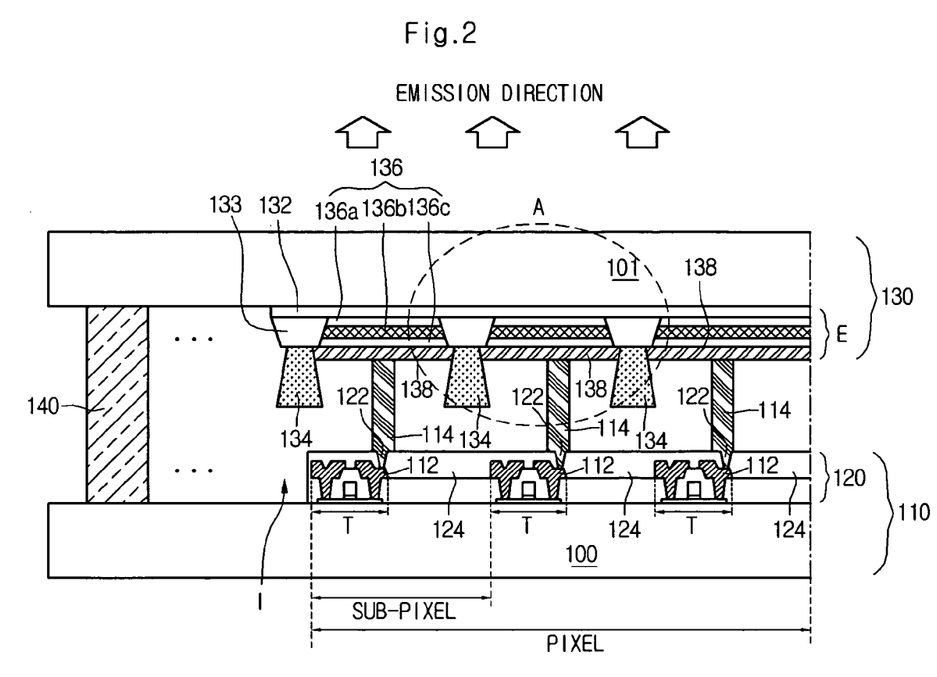
FIG. 2 is a sectional view of a dual panel type organic electro luminescence device.

FIG. 2 is a schematic sectional view of a dual panel type organic electro luminescence device. For convenience of explanation, only one pixel region is illustrated in the drawing.

Referring to FIG. 2, first and second substrates 110 and 130 are arranged spaced apart from each other by a predetermined distance. An array element 120 is formed at an inner surface of a transparent substrate 100 of the first substrate 110. An organic electro luminescent diode E is formed on an inner surface of a transparent substrate 101 of the second substrate 130.

Also, edges of the first and second substrates 110 and 130 are encapsulated by a seal pattern 140.

The organic electro luminescent diode E includes a first electrode 132 used as a common electrode, an electrode separator 134 disposed at a sub-pixel boundary below the first electrode 132, an organic electro luminescent layer 136 disposed between electrode separators 134, and a second electrode 138 patterned for each sub-pixel.

A buffer 133 is formed below the electrode separator 134 to partition the organic electro luminescent layer 136 formed within each sub-pixel and to prevent the first and second electrodes 132 and 138 from being shorted.

The electrode separator 134 separates each sub-pixel and is formed on the buffer 133 in an inverse tapered shape.

The organic electro luminescent layer 136 includes a first carrier transporting layer 136a, an emission layer 136b, and a second carrier transporting layer 136c, which are stacked in sequence. The first and second carrier transporting layers 136a and 136c inject electrons or holes into the emission layer 136b, or transport them.

The first and second carrier transporting layers 136a and 136c are determined by arrangement of anode and cathode electrodes. For example, when the emission layer 136b is formed of high molecular compound and the first and second electrodes 132 and 138 are respectively configured as anode and cathode electrodes, the first carrier transporting layer 136a contacting the first electrode 132 has a stacked structure of a hole injection layer and a hole transporting layer, and the second carrier transporting layer 136c contacting the second electrode 138 has a stacked structure of an electron injection layer and an electron transporting layer.

Also, the organic electro luminescent layer 136 can be formed of a high molecular compound or a low molecular compound. When the organic electro luminescent layer 136 is formed of a low molecular compound, it is formed using a vapor deposition process. When the organic electro luminescent layer 136 is formed of a high molecular compound, it is formed using an inkjet process.

An array element 120 includes TFTs T. In order to supply a current to the organic electro luminescent diode E, cylindrical conductive spacers 114 are disposed at positions where the second electrode 138 and the TFTs T are connected in a sub-pixel unit.

Unlike a spacer for a general LCD, the conductive spacers 114 electrically connect the two substrates as well as maintain a cell gap. The spacers 114 have constant height in a gap between the two substrates.

That is, the conductive spacer 114 electrically connects a drain electrode 112 of the TFT T provided on the first substrate in sub-pixel unit with the second electrode 138 provided on the second substrate 130. The conductive spacer 114 is formed by coating a cylindrical spacer formed of an organic insulating layer with a metal. Because of the conductive spacer 114, pixels of the first and second substrates 110 and 130 are attached in a 1:1 correspondence, such that a current can flow therethrough.

The connection portion between the conductive spacer 114 and the TFT T will now be described in more detail. The TFT T corresponds to a drive TFT connected to the organic electro luminescent diode E. A passivation layer 124 is formed at a region that covers the TFT T. The passivation layer 124 includes a drain contact hole 122 to expose a portion of the drain electrode 112. A conductive spacer 114 is formed on the passivation layer 124 and is connected to the drain electrode 112 through the drain contact hole 122. The metal for the conductive spacer 114 is selected from a conductive material, preferably a metal having ductility and low specific resistance.

According to an embodiment of the present invention, the organic electro luminescence device is a top emission type that emits light from the organic electro luminescent layer 136 toward the second substrate 130.

Preferably, the first electrode 132 is formed from a transparent conductive material, while the second electrode 138 is formed from an opaque metal. The separated space I between the first substrate 110 and the second substrate 130 can be filled with inert gas or insulating liquid.

Although not shown in the drawing, the array element 120 further includes a scan line, a signal line and power line crossing with the scan line and spaced apart from each other by a predetermined distance, a switching TFT disposed at an overlapped portion of the scan line and the signal line, and a storage capacitor.

In the dual panel type organic electro luminescence device, the array element and the organic electro luminescent diode are configured on different substrates. Therefore, unlike the case where the array element and the organic electro luminescence device are formed on the same substrate, the organic electro luminescent diode is not influenced by the yield of the array element. Thus, the dual panel type organic electro luminescence device can have a good characteristic in terms of the production management of the respective elements.

If a screen is implemented in the top emission under the above-described conditions, the TFTs can be designed without considering aperture ratio, thereby increasing efficiency in the array process. Also, products having high aperture ratio and high resolution can be produced. Since a dual panel type organic electro luminescent diode is formed, outer air can be blocked more effectively compared with the related art top emission type, thereby enhancing stability of the product.

In addition, since the TFT and the organic electro luminescent diode are formed on different substrates, sufficient degrees of freedom with respect to the arrangement of the TFTs can be obtained. Since the first electrode of the organic electro luminescent diode is formed on the transparent substrate, the degree of freedom with respect to the first electrode is increased compared with the related art structure where the first electrode is formed on the array element.

In the dual panel type organic electro luminescence device, the inkjet process is used to form the organic electro luminescent layer 136 of high molecular material. When the organic electro luminescent layer 136 is formed of inkjet high molecular material, the ink to be prevented from overflowing the buffer and the profile and thickness of the film is to be adjusted by limiting the high molecular material to within the emission region of the buffer.

In the dual panel type organic electro luminescence device shown in FIG. 2, however, since the electrode separator 134 formed on the buffer 133 is formed in an inverse tapered shape, the sides are not hydrophobic. That is, the ink for the organic electro luminescent layer 136 is attracted toward the sides of the electrode separator so that it flows into the electrode separator. Consequently, the luminescence is non-uniform due to the overflow between the sub-pixels, blackening is caused by connection with the second electrode, and it is difficult to adjust the thickness of the organic electro luminescent layer. This results in a degradation of picture quality in the organic electro luminescence device.

Figure 3:
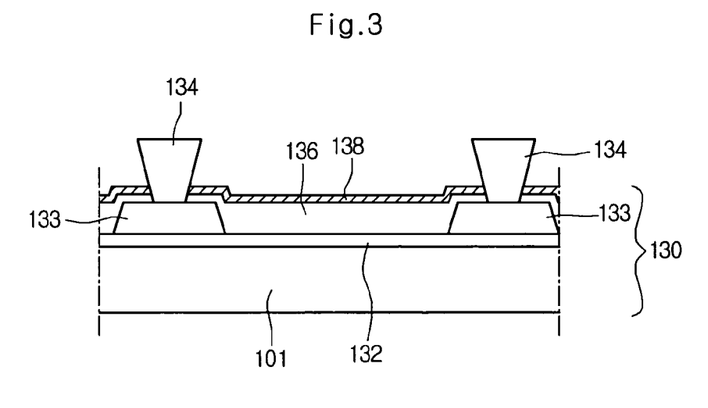
FIG. 3 is a sectional view of a specific portion A in FIG. 2.

FIG. 3 is a sectional view of a specific portion A in FIG. 2.

Referring to FIG. 3, in the dual panel type organic electro luminescence device, the buffer 133 formed on the first electrode 132 of the second substrate 130 functions to partition the emission region within each sub-pixel and the organic electro luminescent layer 136 is formed between the buffers 133.

An inverse tapered electrode separator 134 is formed on the buffer 133. The electrode separator 134 functions to separate the adjacent sub-pixels. Since the second electrode 138 formed on the organic electro luminescent layer 136 is not connected in each sub-pixel, it is separately supplied with a pixel voltage from the TFT of the first substrate 110, which corresponds to each sub-pixel, through the conductive spacer (not shown).

Figure 4:
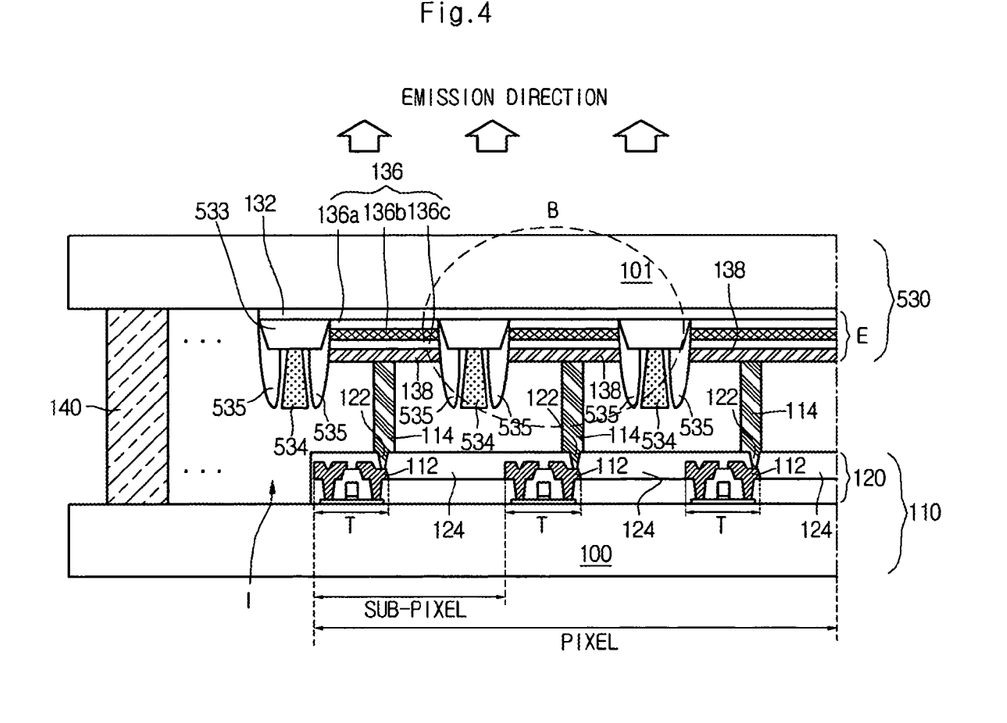
FIG. 4 is a sectional view of a dual panel type organic electro luminescence device according to an embodiment of the present invention.
Figure 5:
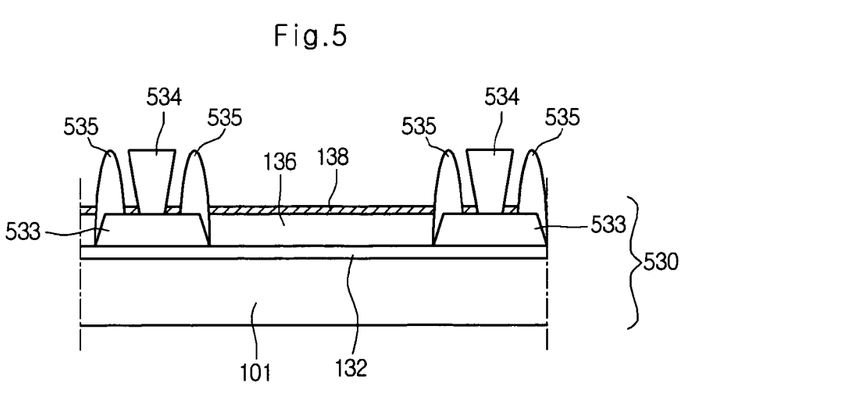
FIG. 5 is a sectional view of a specific portion B in FIG. 4.

FIG. 4 is a schematic sectional view of a dual panel type organic electro luminescence device according to an embodiment of the present invention and FIG. 5 is a sectional view of a specific portion B in FIG. 4.

In FIGS. 4 and 5, the same reference numerals as in FIG. 2 are used to refer to the same elements. A detailed description about those elements will be omitted.

In this embodiment, an organic electro luminescent layer of high molecular material can be uniformly formed by providing a round tapered second electrode separator in a region including a stepped portion of the buffer as well as on the inverse tapered first electrode separator on the buffer of the second substrate. That is, a well type second electrode separator is formed in which the region where the organic electro luminescent layer is formed is surrounded by the second electrode separator.

Referring to FIGS. 4 and 5, a first electrode 132 of an organic electro luminescent diode E is entirely formed on the transparent substrate 101 of the second substrate 530. A buffer 533 is formed on a predetermined portion of the first electrode 132, that is, in an outer side of a sub-pixel to partition each sub-pixel. A first electrode separator 534 is formed on a predetermined portion of the buffer 533, and a second electrode separator 535 is formed on a region including a stepped portion of the buffer 533. As shown, the region for the organic electro luminescent layer is partitioned by the second electrode separator 535, not by the buffer 533.

Also, the first and second electrode separators 534 and 535 divide the second electrode 138 into a plurality of electrodes for each sub-pixel. Here, the first electrode separator 534 is formed in an inverse tapered shape, while the second electrode separator 535 is formed in a round tapered shape.

As mentioned above, in the dual panel type organic electro luminescence device, the inkjet process is used to form the organic electro luminescent layer 136 of high molecular material. When the organic electro luminescent layer 136 is formed of inkjet high molecular material, the ink is to be prevented from overflowing the buffer and the profile and the thickness of the film is to be adjusted by limiting the high molecular material within the emission region of the buffer. Therefore, a hydrophobic process is provided to contain the ink in a specified area.

However, the inverse taper of the sides of the first electrode separator 134 does not contain the movement of the ink. In fact, the ink is attracted toward the sides of the electrode separator, so that it flows into the electrode separator. To combat this, the round tapered second electrode separator 535 is formed at a region including the stepped portion of the buffer 533, thereby providing hydrophobic sides. Accordingly, the ink is prevented from flowing into the sides of the first electrode separator 534 or the stepped portion of the buffer 535. That is, the second electrode separator 535 shields the effect of the ink attraction caused by the inverse tapered first electrode separator 534 and the stepped portion of the buffer 533.

Consequently, by forming the second electrode separator 535 at the region including the stepped portion of the buffer, the overflow of the ink between the sub-pixels, blackening caused by the connection with the second electrode, and difficulty in adjusting the thickness of the organic electro luminescent layer are prevented. Accordingly, picture quality in the organic electro luminescence device can be improved.

Also, the organic electro luminescent layer 136 is formed at the region partitioned by the second electrode separator 535 in each sub-pixel, and the second electrode 138 is formed on the second substrate including the organic electro luminescent layer 136.

Here, the organic electro luminescent layer 136 is formed of high molecular material, and the second electrode 138 is divided by the first and second electrode separators 534 and 535 in each sub-pixel. Accordingly, the second electrode separator 534 serves as the pixel electrode.

Also, since the conductive spacer 114 is formed of metal material, it is electrically connected to the second electrode 138.

Further, the array element 120 formed on the first substrate 110 includes the drive TFT T. In order to supply a current to the organic electro luminescent diode E formed on the second substrate 530, the array element 120 is electrically connected through the conductive spacer 114 to the drain electrode 112 of the drive TFT T provided in each sub-pixel.

Figure 6A:
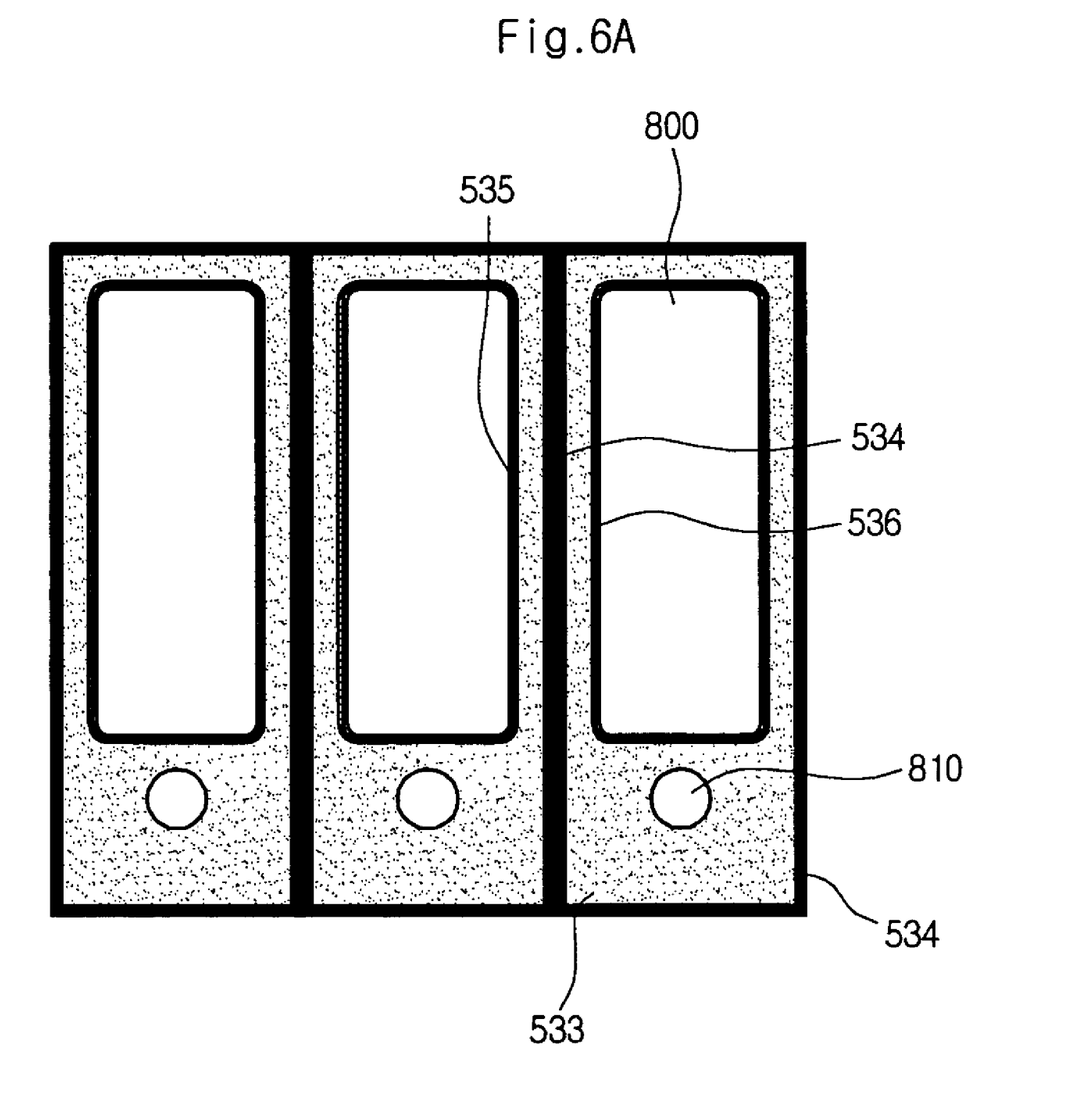
FIGS. 6A and 6B are plan views of a second substrate in the dual panel type organic electro luminescence device shown in FIG. 4.
Figure 6B:
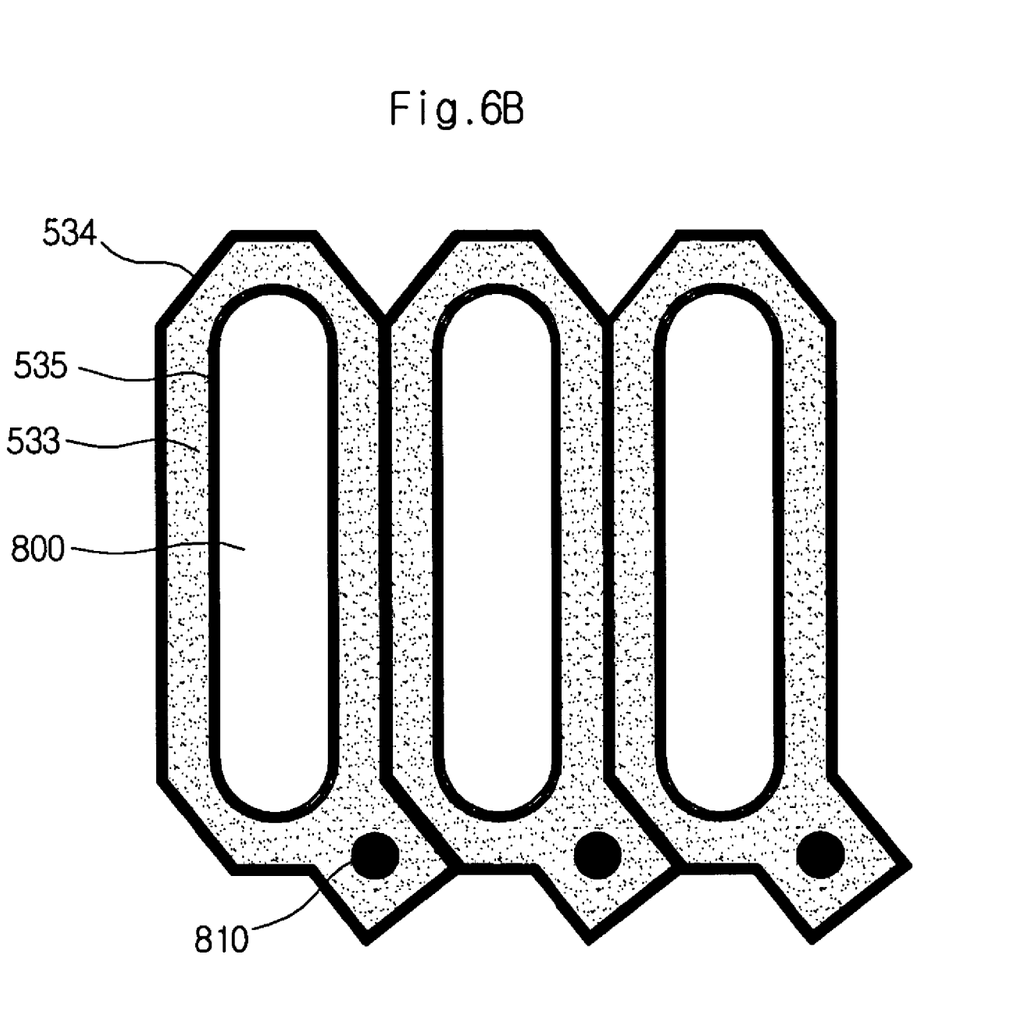

FIGS. 6A and 6B are schematic plan views of the second substrate of the dual panel type organic electro luminescence device shown in FIG. 4. In FIGS. 6A and 6B, only one pixel region (that is, three sub-pixels) is illustrated for conciseness.

The illustrations in FIGS. 6A and 6B are only the exemplary embodiments of the present invention and various types of the structures can be applied to the present invention.

Referring to FIG. 3A, each of the sub-pixels are partitioned and separated from one another by the buffer 533 and the first and second electrode separators 534 and 535. Specifically, the second electrode separator 535 is formed at the region including the stepped portion of the buffer 533. That is, a well type second electrode separator 535 is formed, in which the region where the organic electro luminescent layer is formed is surrounded by the second electrode separator.

Accordingly, as shown in FIG. 6A, the emission region 800 of each sub-pixel is defined by the second electrode separator 535 and the organic electro luminescent layer 136 is formed within the emission region.

Here, when the organic electro luminescent layer is formed of high molecular material, a region 810 contacting the conductive spacer provided in each sub-pixel of the first substrate is formed out of the emission region of the second substrate such that a uniform film can be obtained by not obstructing the flow of the high molecular ink.

Referring to FIG. 6B, each of the sub-pixels includes: the polygonal buffer 533 formed corresponding to each sub-pixel; the first electrode separator 534 formed at the outer region on the buffer to partition the sub-pixels; the second electrode separator 535 formed at the region including the stepped portion of the buffer 533; the emission region 800 where the inner side of the buffer (that is, the corner disposed in the region partitioned by the second electrode separator 535) is rounded; and the contacting part 810 of the conductive spacer, disposed at the region protruded from one side of the polygonal buffer.

The outer appearance of each sub-pixel is formed in the polygonal structure, and the corner of the emission region 800 in the sub-pixel is rounded. The contacting part of the conductive spacer, which is connected to the array element of the first substrate, is formed on one side of the sub-pixel's corner.

In the embodiments of FIGS. 6A and 6B, in order not to position the contacting part 810 within the emission region 800, the first and second substrates are attached such that they are misaligned by a predetermined distance.

FIGS. 7A to 7F are sectional views illustrating a fabrication method of an organic electro luminescence device according to an embodiment of the present invention, focusing on the sectional view of FIG. 4

Figure 7A:
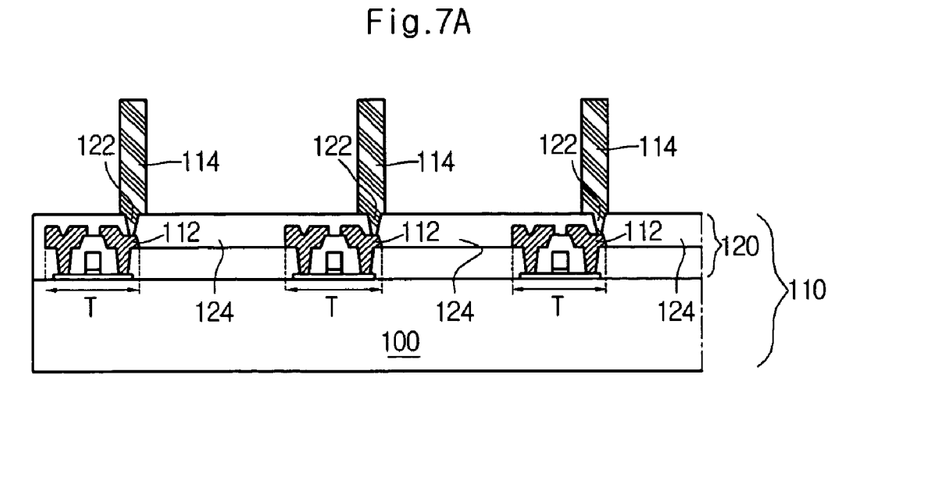
FIGS. 7A and 7F are sectional views illustrating a fabrication method of an organic electro luminescence device according to an embodiment of the present invention.

Referring to FIG. 7A, the array element is formed on the first substrate.

For example, when the TFT for the array element 120 is a polysilicon TFT, the method for forming the array element 120 includes: forming a semiconductor layer and a capacitor electrode on a transparent substrate 100; forming a gate electrode, and source and drain electrodes on the semiconductor layer; and forming a power electrode on the capacitor electrode, the power electrode being connected to the source electrode.

Also, the passivation layer 124 is formed on the region covering the TFT T. The passivation layer 124 has a drain contact hole 122 to expose a portion of the drain electrode 112. The drain electrode 122 is exposed through the drain contact hole 122.

The drain electrode comes in contact with the conductive spacer, which will be formed on the second substrate. Consequently, it electrically connects the first substrate and the second substrate. An electrical connection pattern connected to the drain electrode 112 can be formed to contact with the conductive spacer 114. Preferably, after the array element is formed on the first substrate, the conductive spacer 114 is formed on the first substrate.

Figure 7B:
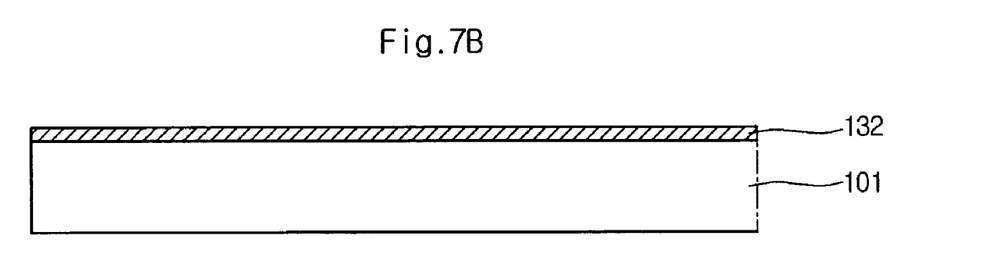

Referring to FIG. 7B, the first electrode 132 of the organic electro luminescent diode is formed on the transparent substrate 101 of the second substrate. Preferably, the first electrode 132 is formed of transparent conductive material, such as indium tin oxide (ITO).

Figure 7C:
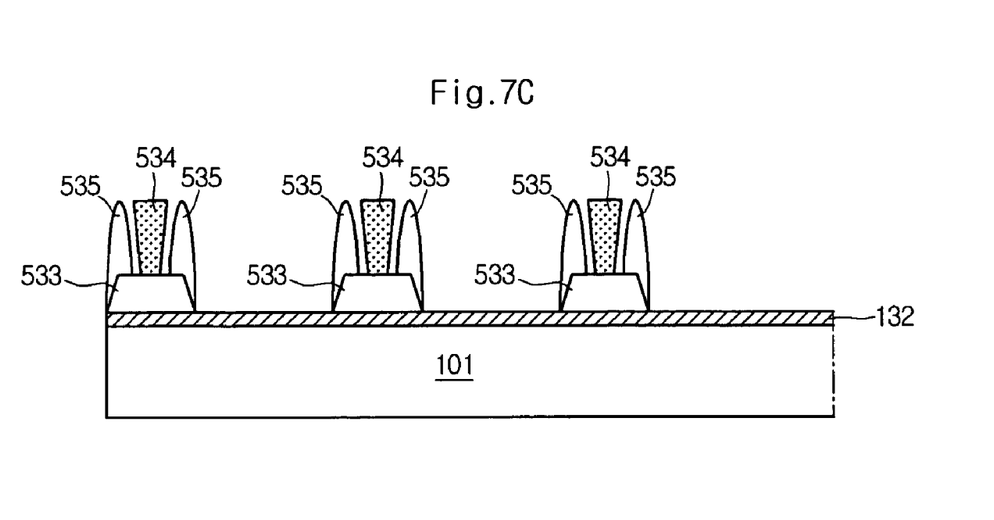

Referring to FIG. 7C, the buffer 533 for partitioning the sub-pixels is formed at a predetermined region on the first electrode, that is, an outer region of the sub-pixel. The first electrode separator 534 is formed in a predetermined region where the buffer 533 is formed, and the second electrode separator 535 is formed in the region including the stepped portion of the buffer. That is, the well type second electrode separator 535 is formed, in which the region where the organic electro luminescent layer is formed is surrounded.

Accordingly, the emission region of each sub-pixel is defined by the second electrode separator 535.

Also, the first and second electrode separators 534 and 535 separate the second electrode according to each sub-pixel. Here, the first electrode separator 534 is formed in the inverse tapered shape and the second electrode separator 535 is formed in a round tapered shape.

By forming the second electrode separator 535 in the round tapered shape at the region including the stepped portion of the buffer 533, it is possible to form a hydrophobic second electrode separator 535. Accordingly, the problem that the ink flows into the sides of the first electrode separator 534 or the stepped portion of the buffer 535 can be solved. That is, the second electrode separator 535 shields the effect of the ink attraction caused by the inverse taper shape of the first electrode separator 534 and the stepped portion of the buffer 533.

Figure 7D:
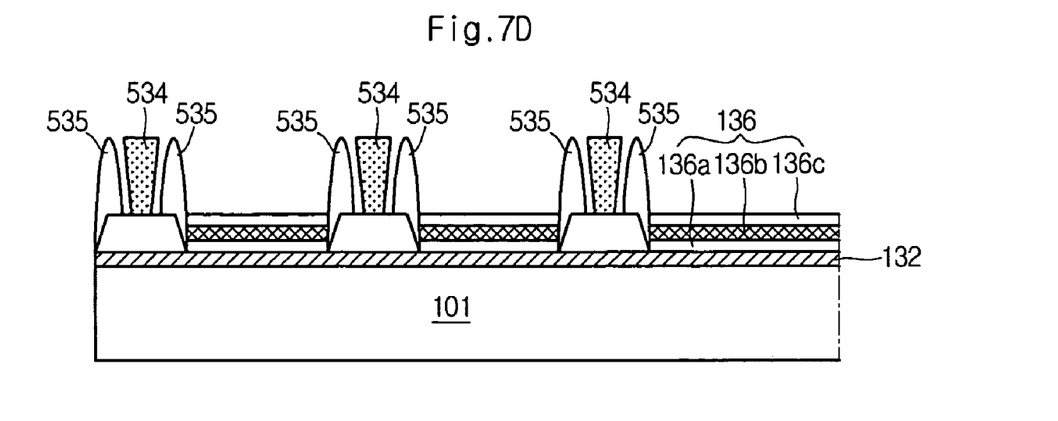

Referring to FIG. 7D, the organic electro luminescent layer 136 is formed within the region defined by the second electrode separator 535.

The organic electro luminescent layer 136 is formed of high molecular material. When the first and second electrodes are the anode and the cathode, respectively, the organic electro luminescent layer 136 includes the hole transporting layer 136*a*, the emission layer 136*b*, and the electron transporting layer 136*c*, which are stacked in sequence. The hole/electron transporting layers 136*a* and 136*c* are used to inject holes or electrons into the emission layer 137*b*, and to transport them. The organic electro luminescent layer 136 can also be formed of low molecular material.

The hole transporting layer 136*a* contacting the first electrode has a stacked structure of a hole injection layer and a hole transporting layer, and the electron transporting layer 136*c* contacting the second electrode has a stacked structure of a electron injection layer and a electron transporting layer.

Figure 7E:
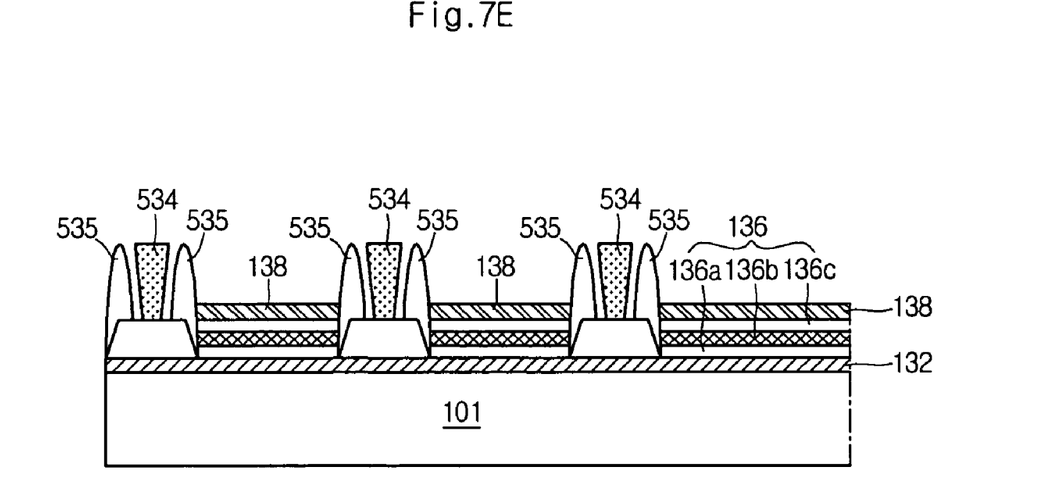

Referring to FIG. 7E, after the organic electro luminescent layer 136 is formed within the emission region defined by the second electrode separator 535, the second electrode 138 of the organic electro luminescent diode is formed on the organic electro luminescent layer 136.

Since the second electrode 138 is divided by the first and second electrode separators 534 and 535 in each sub-pixel, it serves as the pixel electrode. Since the conductive spacer 114 is formed of metal material, it is electrically connected to the second electrode 138. Preferably, the second electrode 138 is formed of a metal having a low work function (e.g., aluminum (Al)).

Figure 7F:
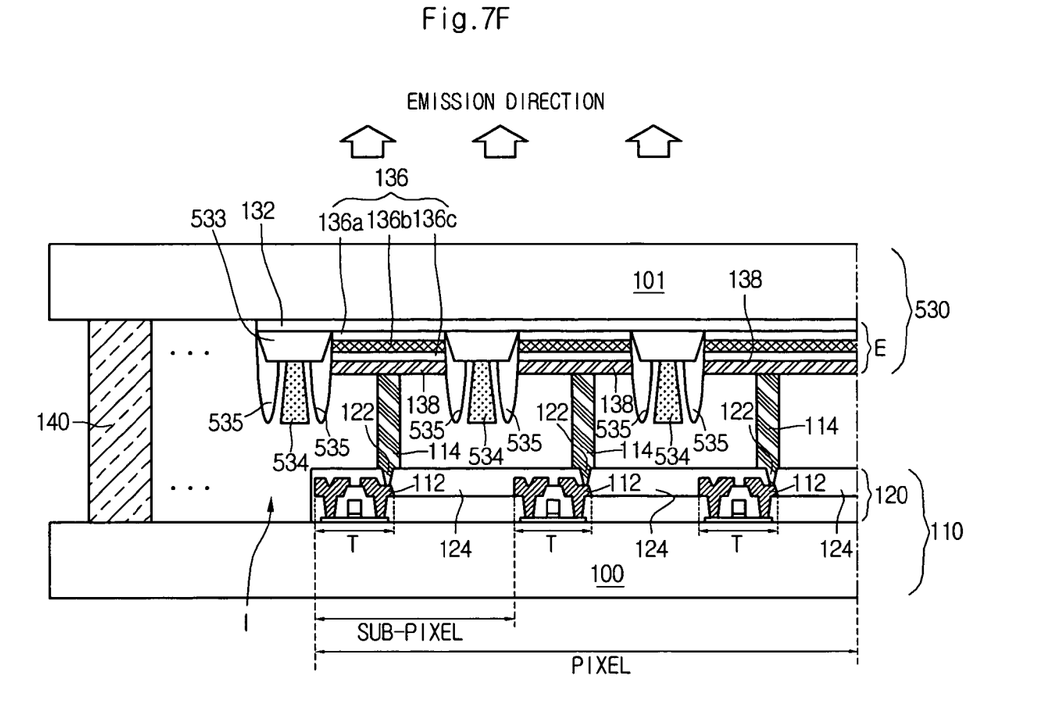

Referring to FIG. 7F, if the first and second substrates 110 and 130 are attached to each other and encapsulated, the first and second substrates 110 and 130 are electrically connected to each other. Consequently, the second electrode 138 of the organic electro luminescent diode formed on the second substrate 530 is electrically connected to the drain electrode 112 of the drive TFT formed on the first substrate 410.

According to the present invention, production yield and production management efficiency can be enhanced. Since a top emission type organic electro luminescence device is formed, the design of the TFTs becomes easy and high aperture ratio and high resolution can be provided. Also, since the electrode for the organic electro luminescence diode is formed on the substrate, various materials can be used. In addition, since a top emission type organic electro luminescence device is formed that has an encapsulation structure, reliable products can be provided.

Also, the organic electro luminescent layer containing the high molecular material can be uniformly formed by further forming the electrode separator in a round tapered shape at the region including the stepped portion of the buffer. The attraction effect of the high molecular ink can be reduced by removing the stepped portion of the buffer in the inkjet process, thereby expanding the jetting directionality margin.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An organic electro luminescence device comprising:
   first and second substrates arranged spaced apart from each other by a predetermined distance, the first and second substrates facing each other, sub-pixels being defined in the first and second substrates;
   an array element including a switch formed on the first substrate;
   a first electrode formed on an inner surface of the second substrate;
   a buffer formed on an outer region to partition the sub-pixels, the buffer formed on the first electrode;
   a first electrode separator formed on the buffer, and a second electrode separator formed in a region including a stepped portion of the buffer;
   an organic electro luminescent layer formed within a region partitioned by the second electrode separator; and
   a second electrode formed on the second substrate where the organic electro luminescent layer is formed,
   wherein the first electrode separator is formed in an inverse tapered shape and the second electrode separator is formed in a round tapered shape,
   wherein the sides of the second electrode separator are hydrophobic,
   wherein a bottom surface of the second electrode separator is contacted with a top surface of the buffer only,
   wherein the second electrode is formed in each sub-pixel only
   wherein a cross-sectional shape of the second electrode separator has a portion of an ellipse and the first and second electrode separators have same height.

2. The organic electro luminescence device according to claim 1, further comprising a conductive spacer for electrically connecting the switch formed on the first substrate and the second electrode formed on the second substrate, the switch and the second electrode corresponding to each other in each sub-pixel.

3. The organic electro luminescence device according to claim 1, wherein the second electrode separator is formed in a well type shape, in which the region where the organic electro luminescent layer is formed is surrounded by the second electrode separator.

4. The organic electro luminescence device according to claim 1, wherein the organic electro luminescent layer is formed of low molecular material or high molecular material.

5. The organic electro luminescence device according to claim 2, wherein an emission region of each sub-pixel is defined by the second electrode separator and the conductive spacer contacts the second electrode in a region outside the emission region.

6. The organic electro luminescence device according to claim 5, wherein the buffer has a polygonal shape.

7. The organic electro luminescence device according to claim 6, wherein the emission region has a substantially ovular shape.

8. The organic electro luminescence device according to claim 6, wherein the conductive spacer contacts the second electrode in a corner of the polygonal shape.

9. The organic electro luminescence device according to claim 5, wherein the buffer has a rectangular shape.

10. The organic electro luminescence device according to claim 9, wherein the emission region has a substantially rectangular shape.

11. A fabrication method of an organic electro luminescence device, the fabrication method comprising:
forming an array element including a switch formed on an inner surface of a first substrate;
forming a first electrode on a transparent substrate;
forming a buffer at an outer region of the sub-pixels to partition the sub-pixels, the buffer formed on the first electrode;
forming a first electrode separator on a predetermined portion of the buffer, and forming a second electrode separator in a region including a stepped portion of the buffer;
forming an organic electro luminescent layer within a region partitioned by the second electrode separator;
forming a second electrode on the second substrate where the organic electro luminescent layer is formed; and
attaching the first and second substrates,
wherein the first electrode separator is formed in an inverse tapered shape and the second electrode separator is formed in a round tapered shape,
wherein the sides of the second electrode separator are hydrophobic,
wherein a bottom surface of the second electrode separator is contacted with a top surface of the buffer only,
wherein the second electrode is formed in each sub-pixel only,
wherein a cross-sectional shape of the second electrode separator has a portion of an ellipse and the first and second electrode separators have same height.

12. The fabrication method according to claim 11, further comprising forming a conductive spacer for electrically connecting the switch formed on the first substrate and the second electrode formed on the second substrate, the switch and the second electrode corresponding to each other in each sub-pixel.

13. The fabrication method according to claim 11, wherein the second electrode separator is formed in a well type shape, in which the region where the organic electro luminescent layer is formed is surrounded by the second electrode separator.

14. The fabrication method according to claim 11, wherein the organic electro luminescent layer is formed of high molecular material.

15. The fabrication method according to claim 14, wherein the high molecular material is formed using an inkjet method.

16. An organic electro luminescence device comprising:
a substrate;
a first electrode formed on an inner surface of the substrate;
a buffer formed on the first electrode and defining a sub-pixel;
a first electrode separator formed on the buffer;
an insulating second electrode separator covering a stepped portion of each side of the buffer formed such that adjacent second electrode separators are disposed on opposing sides of the first electrode separator in a cross-sectional view;
an organic electro luminescent layer formed within a region partitioned by the second electrode separators; and
a second electrode formed on the substrate where the organic electro luminescent layer is formed,
wherein the first electrode separator is formed in an inverse tapered shape and the second electrode separator is formed in a round tapered shape,
wherein the sides of the second electrode separator are hydrophobic,
wherein a bottom surface of the second electrode separator is contacted with a top surface of the buffer only,
wherein the second electrode is formed in each sub-pixel only wherein a cross-sectional of the second electrode separator has a portion of an ellipse and the first and second electrode separators have same height.

17. The organic electro luminescence device according to claim 16, wherein the organic electro luminescent layer is formed only within the region partitioned by the second electrode separator.

18. The organic electro luminescence device according to claim 16, wherein a second electrode is formed only where the organic electro luminescent layer is formed.

19. The organic electro luminescence device according to claim 16, wherein the second electrode separator has a particular shape and extends sufficiently from the substrate such that high molecular material forming the organic electro luminescent layer does not overflow a region between sides of the second electrode separator.

20. The organic electro luminescence device according to claim 16, wherein the second electrode separator extends from the substrate at least as far as the first electrode separator.

21. The organic electro luminescence device according to claim 16, wherein the first and second electrode separators have different shapes.

22. The organic electro luminescence device according to claim 16, wherein the buffer has a flat region on which the first electrode separator is disposed, and the second electrode separator covers an end portion of flat region of the buffer.

23. The organic electro luminescence device according to claim 16, wherein the buffer has a polygonal shape.

24. The organic electro luminescence device according to claim 23, wherein an emission region of the sub-pixel defined by the second electrode separator has a substantially ovular shape.

25. The organic electro luminescence device according to claim 16, wherein the buffer has a rectangular shape.

26. The organic electro luminescence device according to claim 25, wherein an emission region of the sub-pixel defined by the second electrode separator has a substantially rectangular shape.

27. The organic electro luminescence device according to claim 16, wherein an emission region of the sub-pixel defined by the second electrode separator and the buffer have substantially the same shape.

* * * * *